(12) United States Patent
Moreno Granado et al.

(10) Patent No.: US 9,362,884 B2
(45) Date of Patent: Jun. 7, 2016

(54) MICRO-ACOUSTIC FILTER HAVING COMPENSATED CROSS-TALK AND METHOD FOR COMPENSATION

(75) Inventors: Guillermo Moreno Granado, Munich (DE); Jürgen Kiwitt, Munich (DE); Maximilian Pitschi, Rottach-Egern (DE); Tilo Gärtner, Munich (DE)

(73) Assignee: EPCOS AG, Munich (DE)

( * ) Notice: Subject to any disclaimer, the term of this patent is extended or adjusted under 35 U.S.C. 154(b) by 790 days.

(21) Appl. No.: 13/576,653

(22) PCT Filed: Feb. 14, 2011

(86) PCT No.: PCT/EP2011/052136
§ 371 (c)(1),
(2), (4) Date: Sep. 7, 2012

(87) PCT Pub. No.: WO2011/101314
PCT Pub. Date: Aug. 25, 2011

(65) Prior Publication Data
US 2012/0326808 A1    Dec. 27, 2012

(30) Foreign Application Priority Data

Feb. 22, 2010  (DE) .......................... 10 2010 008 774

(51) Int. Cl.
*H03H 9/64* (2006.01)
*H03H 9/02* (2006.01)

(52) U.S. Cl.
CPC ....... *H03H 9/02874* (2013.01); *H03H 9/02913* (2013.01); *H03H 9/02952* (2013.01); *H03H 9/02992* (2013.01); *H03H 9/6493* (2013.01)

(58) Field of Classification Search
CPC .......... H03H 9/02874; H03H 9/02913; H03H 9/02952; H03H 9/02992; H03H 9/6423; H03H 9/6493; H03H 3/08; H03H 9/64
USPC ............................... 333/193–195; 310/313 B
See application file for complete search history.

(56) References Cited

U.S. PATENT DOCUMENTS 4,066,985 A * 1/1978 Kuny ............................. 333/194
4,314,215 A * 2/1982 Tanji et al. .................... 333/193
(Continued)

FOREIGN PATENT DOCUMENTS

CN         1333596 A      1/2002
DE    102004037821 A1    3/2006
(Continued)

OTHER PUBLICATIONS

English language machine translation of DE 10 2004 037 821, published Mar. 16, 2006.*
(Continued)

*Primary Examiner* — Barbara Summons
(74) *Attorney, Agent, or Firm* — McDermott Will & Emery LLP

(57) ABSTRACT

The invention relates to a micro-acoustic filter having a first and a second converter, in which the electromagnetic and capacitive cross-talk between the first and second converters is compensated for by providing additional coupling capacitors and additional current loops. Additional coupling capacitors and current loops are arranged in such a manner that they can counteract the sign of the natural coupling specified by the design and thus completely compensate for said coupling.

11 Claims, 5 Drawing Sheets

(56) References Cited

U.S. PATENT DOCUMENTS

Figure 1:
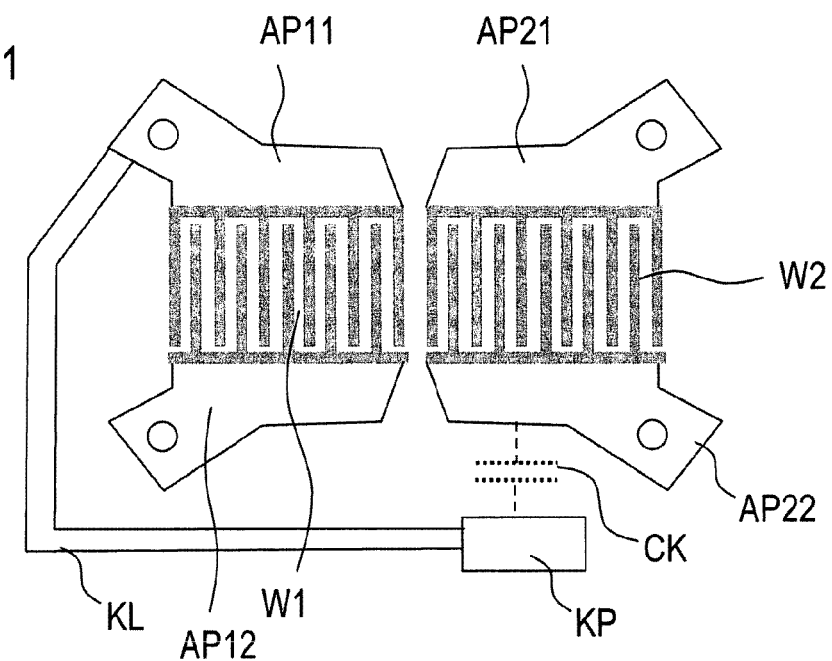

| | | | |
|---|---|---|---|
| 4,365,219 A * | 12/1982 | Nathan | 333/193 |
| 4,672,339 A * | 6/1987 | Zibis et al. | 333/194 |
| 4,764,701 A * | 8/1988 | Garbacz et al. | 310/313 R |
| 5,363,073 A | 11/1994 | Higgins | |
| 6,353,372 B1 * | 3/2002 | Baier et al. | 333/195 |
| 6,377,137 B1 * | 4/2002 | Ruby | 333/189 |
| 6,441,704 B1 | 8/2002 | Ali-Hackl et al. | |
| 6,535,080 B2 * | 3/2003 | Taniguchi | 333/193 |
| 6,822,537 B1 * | 11/2004 | Taniguchi et al. | 333/194 |
| 6,853,113 B2 * | 2/2005 | Bergmann | 310/313 D |
| 6,924,716 B2 | 8/2005 | McMurtre | |
| 7,116,187 B2 | 10/2006 | Inoue | |
| 7,710,221 B2 * | 5/2010 | Kajihara | 333/193 |
| 2005/0007215 A1 | 1/2005 | McMurtre | |
| 2005/0110599 A1 * | 5/2005 | Kanasaki et al. | 333/193 |
| 2005/0225410 A1 * | 10/2005 | Anasako | 333/193 |
| 2006/0197630 A1 * | 9/2006 | Fuse | 333/133 |
| 2008/0246560 A1 * | 10/2008 | Detlefsen | 333/195 |

FOREIGN PATENT DOCUMENTS

| | | |
|---|---|---|
| GB | 1441602 | 7/1976 |
| JP | S50086955 A | 7/1975 |
| JP | 57004613 | 1/1982 |
| JP | 57162816 | 10/1982 |
| JP | 60264112 | 12/1985 |
| JP | 61264810 | 11/1986 |
| JP | 62181037 | 11/1987 |
| JP | 02-104013 A | 4/1990 |
| JP | 03019415 U | 1/1991 |
| JP | 03104409 U | 5/1991 |
| JP | 4-094206 * | 3/1992 |
| JP | 2002503414 A | 1/2002 |
| JP | 2003051731 A | 2/2003 |
| JP | 2008516488 A | 5/2008 |

OTHER PUBLICATIONS

Japanese Office Action mailed Dec. 2, 2014, 4 pages.

Sawtek Preliminary Data Sheet, Part No. 856270, Mar. 26, 2004, pp. 1-5.

Sawtek Preliminary Data Sheet, Part No. 855271, Oct. 13, 2005, pp. 1-6.

Japanese Office Action Mailed Aug. 18, 2015, 4 pages.

* cited by examiner

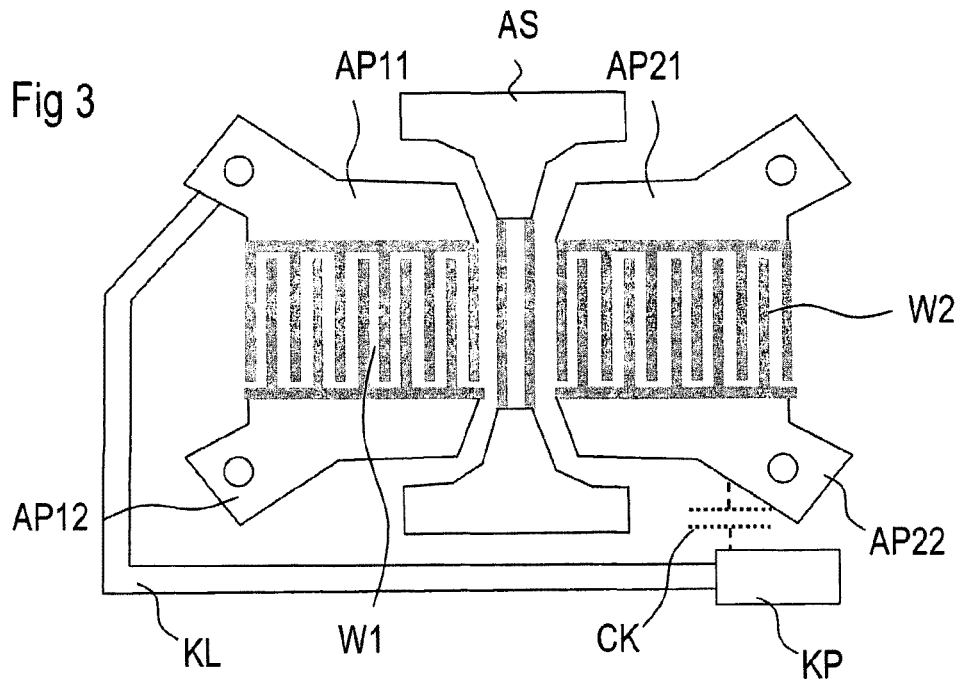
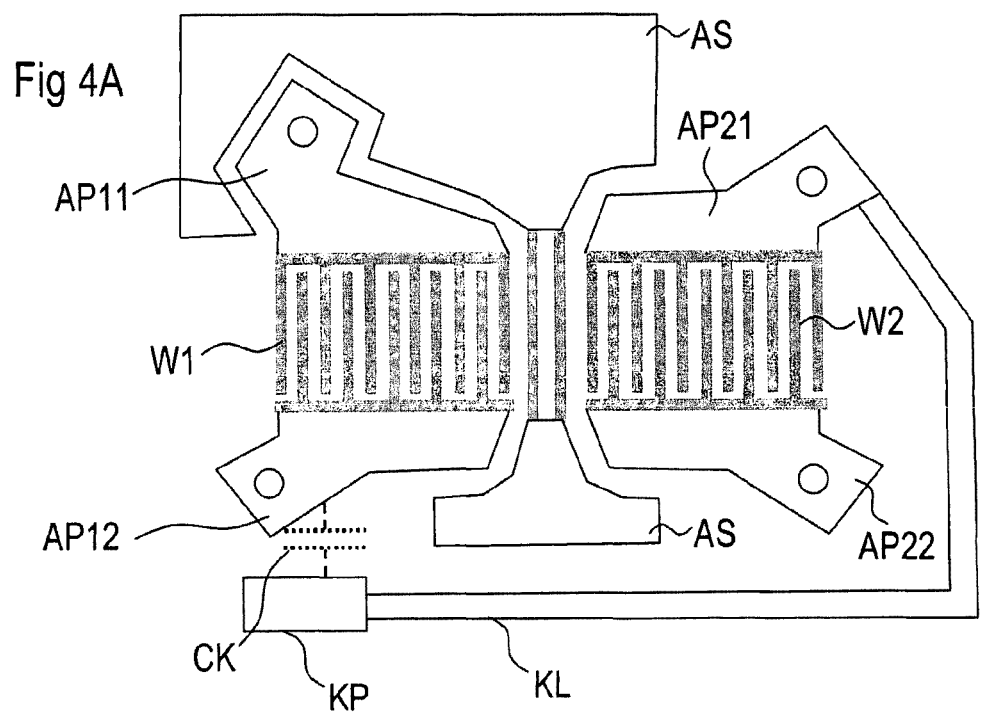

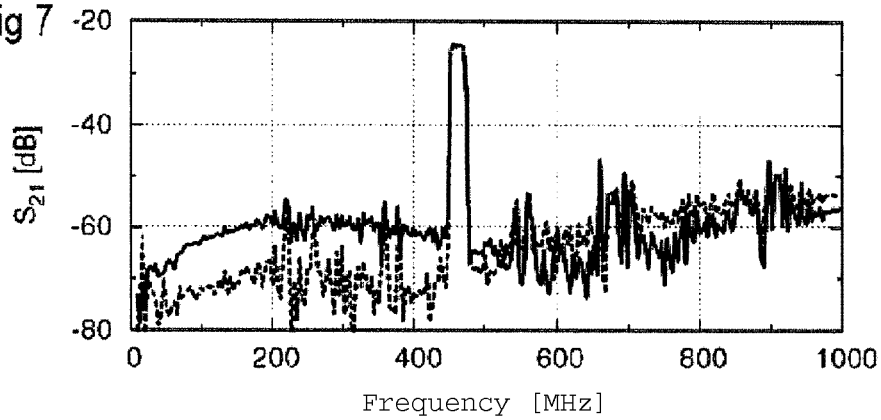
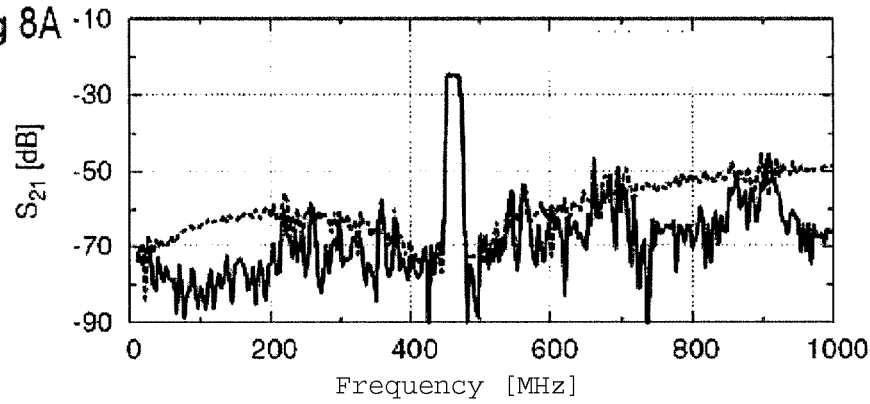
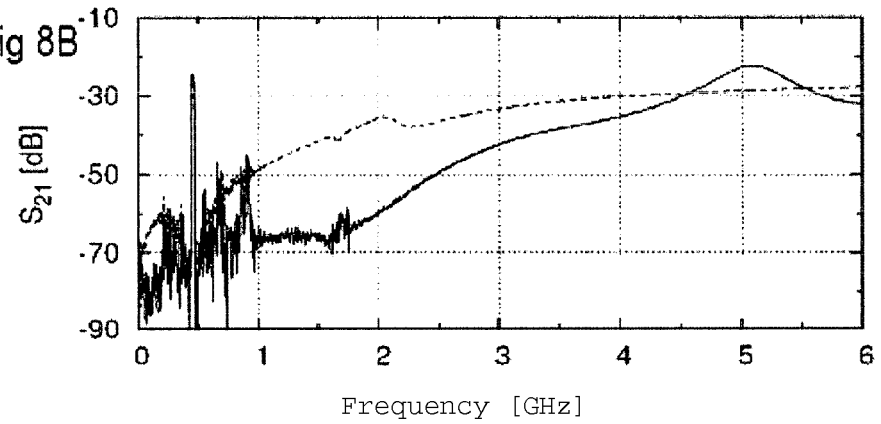

MICRO-ACOUSTIC FILTER HAVING COMPENSATED CROSS-TALK AND METHOD FOR COMPENSATION

The selection of micro-acoustic filters such as SAW filters (SAW=surface acoustic wave) or BAW filters (BAW=bulk acoustic wave), is influenced by electromagnetic cross-talk. An optimum and reproducible selection requires suppression of the electromagnetic cross-talk below the level of the acoustic system in the stop band.

Cross-talk occurs if two current-carrying metallizations such as electrodes, transducers or leads, which are connected to the input and output, respectively, and which couple electromagnetically to one another, are present in the filter. Such a coupling can comprise one or a plurality of different interactions, which either are effected by action at a distance via capacitive, inductive or waveguide coupling or constitute a direct coupling via a direct electrical connection. Cross-talk leads to interactions between the input and the output of filters which are not determined by the acoustic system. Therefore, cross-talk leads to undesired signals in the transfer function which impair the abovementioned selection in the stop band.

In order to reduce capacitive cross-talk it is known to arrange shielding structures, for example a shielding bar connected to ground, between input and output transducers. Such a shielding bar can be realized, for example, in the form of additional reflector strips or in the form of widened electrode fingers of the transducer that are situated terminally in the transducer and are connected to ground.

A further possibility consists in complying with a sufficient distance between the input and output transducers.

For a symmetrically/asymmetrically operating SAW filter, it has been proposed to increase the coupling capacitance formed by one of the two symmetrical output connections with respect to an input transducer, in order to obtain the same coupling and therefore mutually compensating coupling capacitances for both output-side connections.

A reduction and local extinction of the electromagnetic cross-talk in a narrow frequency range is also accomplished experimentally by changing the on-chip layout, although this may require a complex optimization depending on manufacturing possibilities.

Electromagnetic cross-talk can likewise be compensated for with the aid of an external passive network.

The abovementioned known measures for compensating for the electromagnetic cross-talk either are limited in their effect or can only be realized in complex fashion.

Therefore, it is an object of the present invention to specify a simple possibility by which electromagnetic cross-talk can be reduced or ideally even completely compensated for.

This object is achieved according to the invention by means of a micro-acoustic filter comprising the features of claim 1. Advantageous configurations of the invention and a method for reducing cross-talk can be gathered from further claims.

A micro-acoustic filter is proposed which comprises a first and a second transducer, which are realized on a common piezoelectric substrate. The first transducer is connected to an input side, and the second transducer to an output side of the filter. Each transducer has two connection pads connected to the different electrodes of the transducer. In the case of an SAW filter, the two connection pads can be arranged on the same side or on different sides of an acoustic track. The arrangement of both connection pads onto the same side of the acoustic track is accomplished, for example, by means of a lengthened electrode finger connecting the busbar on one side of the acoustic track to the connection pad on the other side of the acoustic track.

Furthermore, the micro-acoustic filter comprises a coupling line, which connects a first connection pad of the first transducer to a coupling pad. The coupling pad is embodied as a metal area and is arranged in the vicinity of that connection pad of the second transducer which is at the greater distance from the first connection pad of the first transducer.

With this coupling pad and the lead, an additional electromagnetic coupling is incorporated into the filter, which coupling, in terms of the sign, counteracts the existing electromagnetic coupling that is undesirable but unavoidable by virtue of the design. An undesirable capacitive coupling occurs e.g. usually between such structures at different transducers which are most closely adjacent to one another, generally between adjacent connection pads of the first and second transducers.

With the coupling line and the coupling pad linked thereto, a coupling to the more distant connection pad is produced, said connection pad usually having a polarity opposite to the closest adjacent connection pad. The undesirable coupling between the first and the closest adjacent connection pad is thereby compensated for.

Through suitable dimensioning of the coupling pad and/or suitable choice of the distance between coupling pad and corresponding connection pad of the second transducer, it is possible to set this additional coupling in terms of size. In the optimum case, the undesirable coupling predetermined by the design can even be completely compensated for by the additionally introduced, but oppositely acting coupling.

The additional coupling pad makes it possible to compensate not only for the existing undesirable electromagnetic couplings between input and output transducers or between first and second transducers, but also for the effects brought about by electromagnetic cross-talk between first and second transducers.

The coupling pad and the associated coupling line can be produced with only little area requirement on the surface of the piezoelectric substrate and do not require complex processes for production. The optimization of coupling lines, and in particular of coupling pads, is also accomplished without problems and can be carried out virtually independently of the rest of the design of the SAW or BAW filter.

In one embodiment of the invention, first and second transducers are separated by a shielding structure. The shielding structure comprises a metallic strip, which, in the case of SAW filters, is guided e.g. transversely via the acoustic track, in which the two first and second transducers that couple to one another can be arranged, or which is generally arranged between the connection pads or electrodes of two transducers that couple to one another. The shielding structure reduces the undesirable capacitive cross-talk between first and second transducers.

In a further configuration of the invention, one of the connection pads of the shielding structure that are connected to ground is embodied as a shielding pad and is, for this purpose, guided at least partly around an adjacent connection pad of the adjacent transducer. This means that the shielding pad connected to ground has a greater extent than the adjacent connection pad in one direction—in a transverse direction in the case of SAW filters. Furthermore, it also has a longitudinal extent such that it at least partly overlaps the adjacent connection pad in a longitudinal direction, that is to say parallel to the propagation direction of the acoustic wave.

In one embodiment of the invention, that connection pad of the shielding structure which is connected to ground can be lengthened to form the shielding pad such that it is guided around the adjacent connection pad again in the direction of an acoustic track. In this way, the adjacent connection pad is surrounded by the lengthened shielding pad practically at three sides.

The coupling line can be arranged as a metallic conductor section on the piezoelectric substrate. In the case of SAW filters, the conductor section can be guided completely outside the acoustic track to the coupling pad.

It is also possible to guide the coupling line through the acoustic track and, for this purpose, by way of example, to correspondingly lengthen an electrode finger connected to the first connection pad of the first transducer transversely with respect to the propagation direction and then to continue with a further metallic conductor section on the substrate.

However, it is also possible to embody the coupling line at least partly as a bonding wire.

In a further embodiment, the coupling line comprises conductor sections which are not arranged directly on the substrate, but rather formed above or below the substrate. Such conductor sections can be embodied, for example, on a housing part of the micro-acoustic filter, below the substrate or else, particularly in the case of flip-chip arrangement of the substrate, on a carrier substrate. Vertical connections between conductor sections of the coupling line which are arranged directly on the substrate and those which are not arranged directly on the substrate can be realized by bumps, bonding connections, bonding wires or plated-through holes.

In a further configuration, the SAW filter is embodied such that the electromagnetic coupling between first and second transducers is reduced. For this purpose, in at least one of the transducers, the current path, comprising current feeds and outgoers to the connection pads, the connection pads themselves and that portion of the current path which runs via the acoustic system, is guided such that it forms a crossover at least in a projection onto the surface of the substrate. Said crossover completely closes a first loop and at least partly forms a second current loop. Both loops can couple to an electromagnetic field in each case in mutually opposite ways.

The crossover induces, in the completely closed loop, a field opposite to the field induced in the at least partial second loop. Consequently, the electromagnetic fields that are present and act on the two loops exert mutually counteracting coupling effects on the current paths, which ideally completely compensate for one another.

In the projection of the two loops onto the substrate surface, first and second areas enclosed by the loops arise there, said areas being in an adjustable desired ratio to one another. An optimum ratio can be achieved e.g. when the couplings induced by the two loops correspond to one another in terms of magnitude and compensate for one another on account of the mutually opposite effect.

In a further embodiment, it is proposed also to guide the corresponding current path of the second transducer such that a third loop is formed. This makes it possible, by the variation of the area ratios of the areas enclosed by the loops and projected onto the substrate, to compensate for the electromagnetic coupling and thus the cross-talk between first and second transducers and also between first and third and between second and third loops.

In a further configuration, the current path in the second transducer is guided such that here, too, a crossover of the current-carrying conductor sections arises at least in the abovementioned projection. The filter usually comprises a chip formed from the material of the substrate. Said chip can then be mounted on a housing lower part or on a carrier substrate. The electrical connection between the connection pads on the chip and corresponding connection areas at the housing lower part or on the carrier substrate can be effected by means of bonding wires. In this case, the shaping of the at least one current path to form a completely closed loop can be realized by corresponding guidance of the bonding wires.

However, it is also possible to mount the filter comprising a chip by means of flip-chip mounting of the chip on a housing lower part or a carrier substrate. The bump connections with which the flip-chip mounting is effected in this case constitute the vertical conductor sections of the current path. In order to form the current loops, conductor sections are then provided which run on the housing lower part or on the carrier substrate and via which, projected onto the substrate, the desired crossover can be realized. However, it is also possible to realize the current path by means of conductor sections arranged in more than two mutually different conductor planes. Further conductor planes can be realized, for example, on the underside of the substrate, on the underside of the carrier substrate or on the underside of the housing lower part.

The abovementioned current path comprises at least one section realized by the acoustic system between electrode fingers of different polarities of the same transducer. If this transducer is constructed homogeneously, then the current path smears over the entire transducer area. It can be advantageous if, in the case of a SAW filter, at least one of the transducers is cascaded in a transverse direction, wherein the cascading is different in at least two longitudinal sections of the transducer which subdivide the transducer in a longitudinal direction. The current path then runs substantially via the longitudinal sections having the smallest degree of cascading within the transducer. By correspondingly dividing the transducer into longitudinal sections having different cascading, it is therefore possible to geometrically define the (main) current path within the transducer.

It is advantageous if the longitudinal section having the smallest cascading level is not arranged at that end of the first transducer which faces the adjacent second transducer. In this way, the coupling is reduced intrinsically by the larger distance of the current path in both transducers. According to the invention, however, it can be advantageous to arrange the longitudinal section having the smallest degree of cascading in a longitudinal direction such that the area enclosed by a crossover of the current path and projected onto the surface of the chip has a sufficient size.

The invention is explained in greater detail below on the basis of exemplary embodiments and the associated figures. The latter serve solely for illustrating the invention and have therefore been drawn up schematically, not accurately in every detail and also not in a manner true to scale. For the sake of better illustration, individual parts may also be illustrated in a manner distorted in size.

Figure 2:
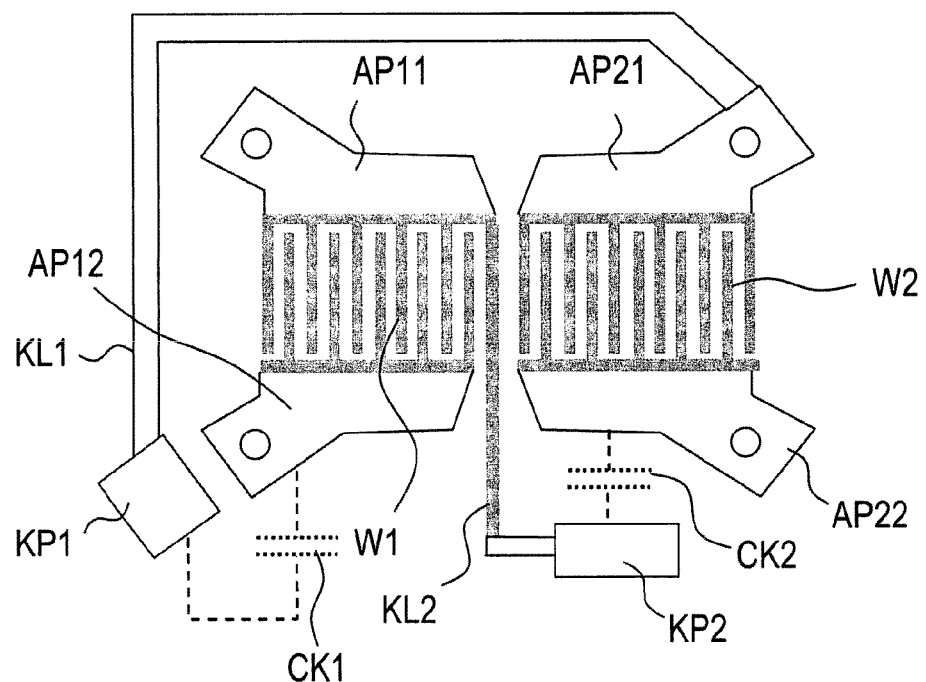
Figure 4B:
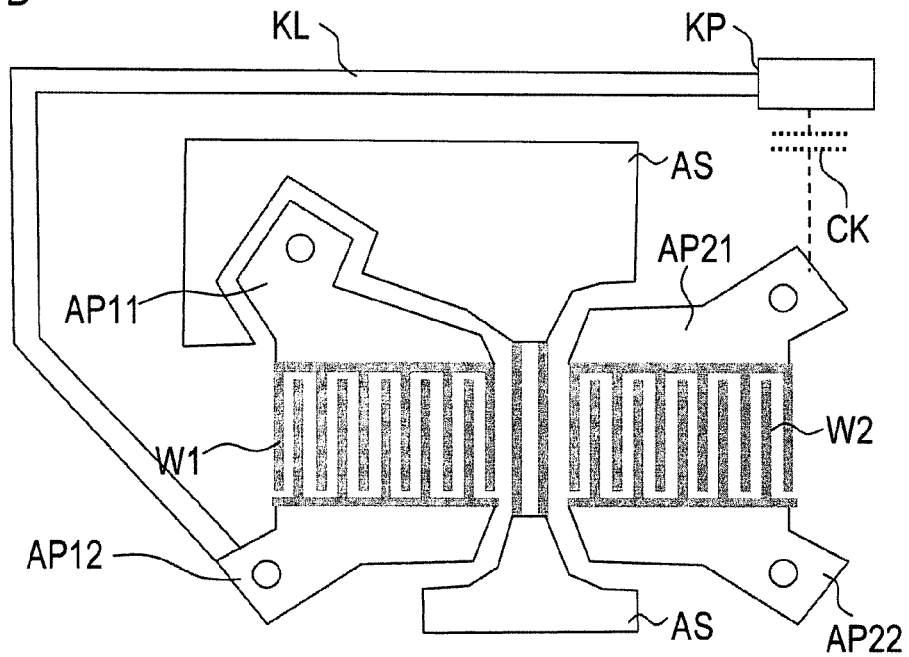
Figure 5:
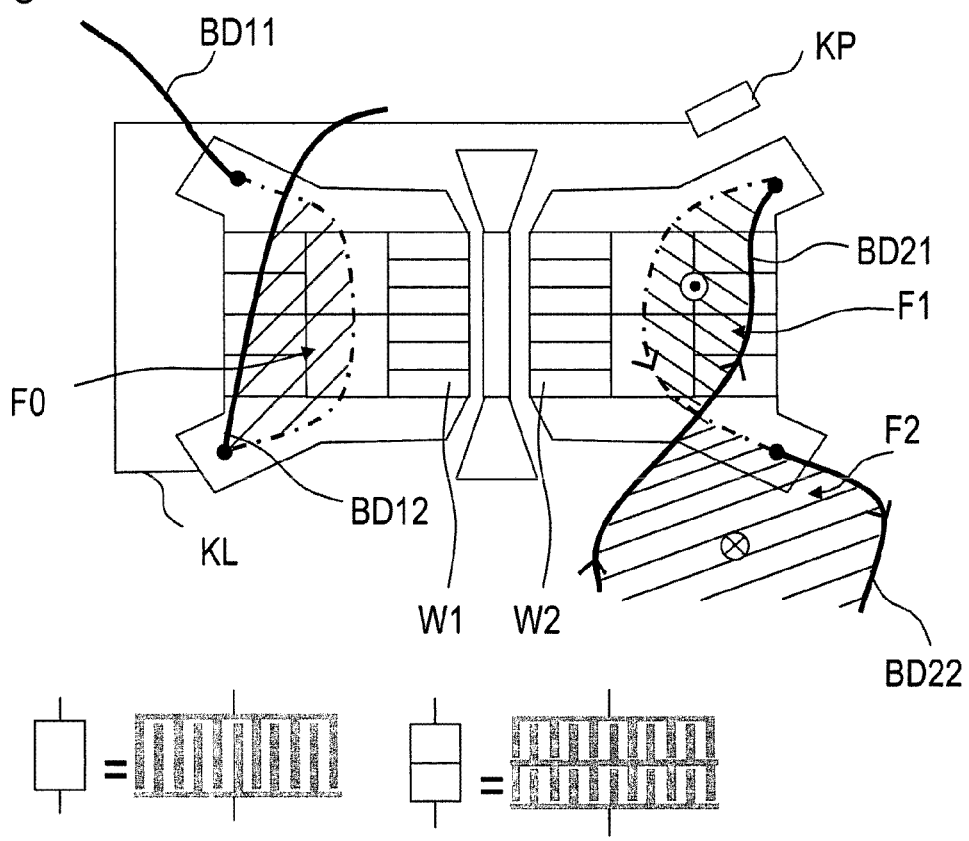
Figure 6:
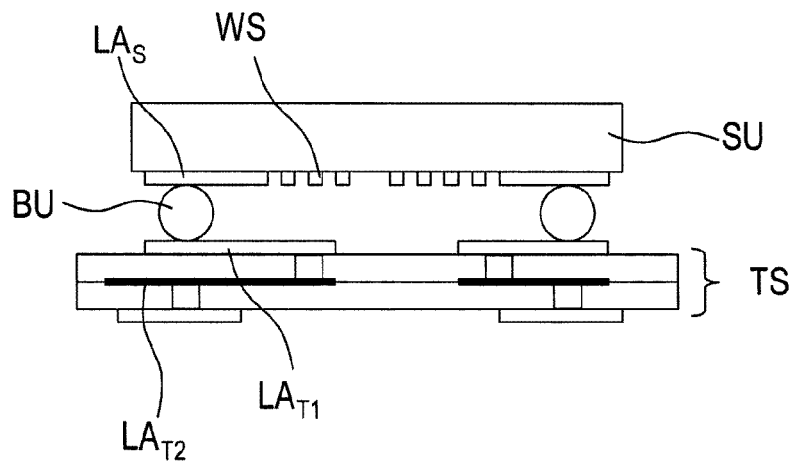
Figure 9:
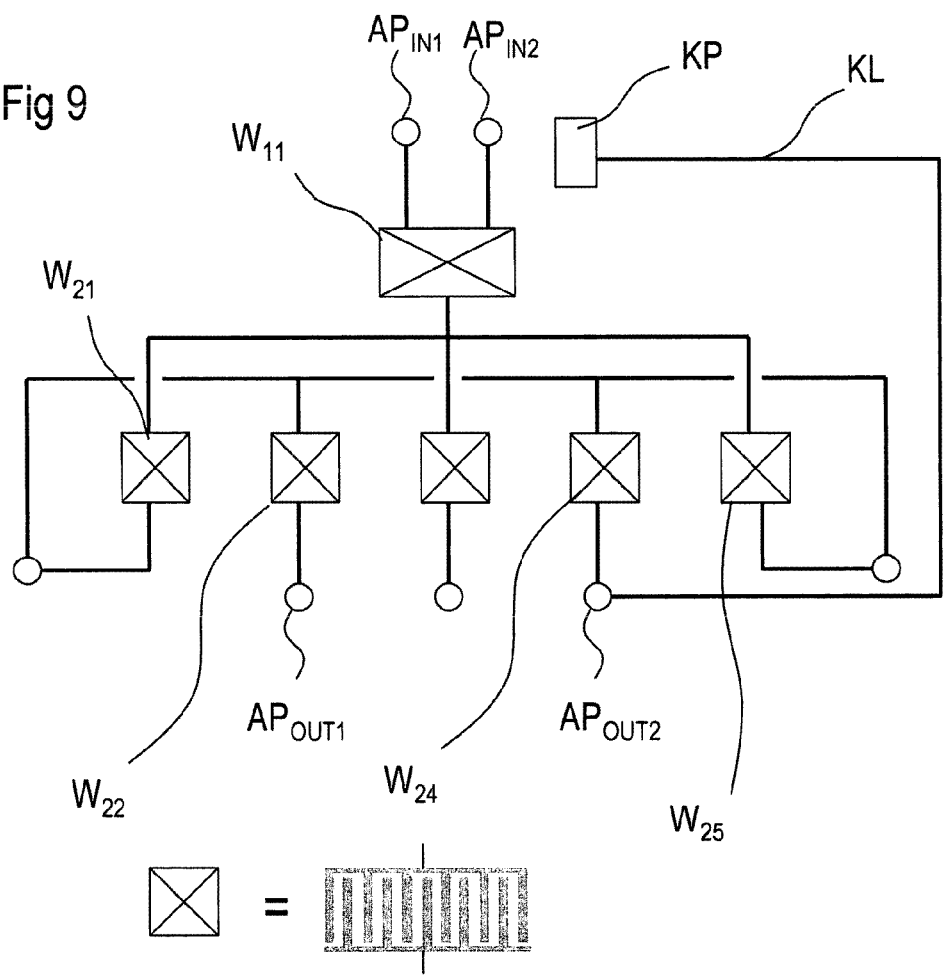

In the figures:

FIG. 1 shows two transducers of a filter with a coupling line leading to a coupling pad, FIG. 2 shows two transducers with two coupling lines leading to a respective coupling pad, FIG. 3 shows two transducers as in FIG. 1, wherein a shielding structure is additionally arranged between first and second transducers, FIG. 4a shows two transducers with a shielding structure as in FIG. 3, wherein a shielding pad is lengthened, FIG. 4b shows two transducers with a variation of a shielding structure as in FIG. 3, wherein a shielding pad is lengthened, FIG. 5 shows two transducers, wherein the current feeds to the transducer in each case form a loop, FIG. 6 shows in schematic cross section a SAW component bonded onto a carrier in flip-chip design, FIG. 7 shows the transfer function for a filter with the two transducers from FIG. 1, FIGS. 8A and 8B show the transfer function of a filter with two transducers as in FIG. 2, FIG. 9 shows a SAW filter, wherein a coupling line couples two transducers arranged in different acoustic tracks.

FIG. 1 shows a simple embodiment of the invention. Two transducers W1 and W2 of a SAW filter are illustrated, which together form a transversal filter or part of a transversal filter. Although illustrated here as standard finger transducers, the transducers W1, W2 can also have an SPUDT or RSPUDT structure, and can additionally also be embodied as FAN transducers or as a weighted transducer. The first transducer W1 has an upper connection pad AP11 and a lower connection pad AP12. The second transducer W2 likewise has an upper connection pad AP21 and a lower connection pad AP22. In addition to the unavoidable electromagnetic coupling between directly adjacent connection pads of different transducers, for example the coupling between the two upper connection pads AP11 and AP21 of first and second transducers, a further coupling between the upper connection pad AP11 of the first transducer W1 and the lower connection pad AP22 of the second transducer is produced here according to the invention. This is achieved by virtue of a coupling pad KP being arranged in the vicinity of the connection pad AP22, said coupling pad forming a coupling capacitance CK with respect to the connection pad AP22. The coupling pad is connected to the upper connection pad AP11 of the first transducer W1 via a coupling line KL, which comprises any desired, if appropriate, structurally different conductor sections and is illustrated here by way of example as a conductor track running on the substrate, the coupling pad is connected to the upper connection pad AP11 of the first transducer W1. Since upper and lower connection pads of a transducer have a different polarity, this additional coupling capacitance CK results in compensation of the existing coupling between the two directly adjacent connection pads AP11 and AP21.

Furthermore, it is now possible to change the size of this additional coupling capacitance CK by means of various simple measures and to set it in a suitable manner such that the two couplings that compensate for one another are identical in terms of magnitude and can thus completely compensate for one another. For this purpose, it is possible to change the distance between the coupling pad KP and the adjacent connection pad AP22. It is simpler, however, to leave the relative position of the two coupling pads and merely to change the size of the coupling pad KP. This can, for example, also be done by subsequent trimming after the filter has been produced.

Furthermore, it is possible, by way of the current conduction to the coupling pad, that is to say by way of the position of the coupling line relative to the two transducers, to produce further electromagnetic and in particular inductive effects in a targeted manner, which can likewise be utilized for compensating for existing couplings.

According to example aspects, a micro-acoustic filter includes a first and a second transducer, which are realized on a common piezoelectric substrate, the first transducer and the second transducer each having two connection pads. The filter further includes a coupling line, which connects a first connection pad of the first transducer to a coupling pad, the coupling pad being embodied as a metal area and is arranged in the vicinity of that connection pad of the second transducer which is at the greater distance from the first connection pad of the first transducer. To reduce cross-talk in such a micro-acoustic filter, the size of the coupling pad and/or the distance thereof is varied from the more distant connection pad of the second transducer until optimum decoupling to is achieved. Example steps include (a) providing the coupling pad with a sufficient size, (b) determining filter properties suitable for determining the coupling, (c) reducing the area of the metallic coupling pad by material removal by a relatively small amount relative to the size of the coupling pad, (d) determining at least one of the filter properties anew, (e) determining whether the at least one of the filter properties has changed positively by comparison with the determination in step (b), and repeating steps (c) and (d) in the case of an improvement being determined. Further example steps for step (b) include determining the transfer function of the filter, and using the suppression in a given stop band as a measure of the coupling. Further example steps include, in method steps (b) and (d), determining the transfer function of the filter and determining the number of phase changes of the transfer function in a given frequency range all around a passband of the filter as a measure of the coupling, where step (e) involves checking whether an increase in the number of phase changes has taken place, and where an increase is evaluated as improved decoupling.

FIG. 2 shows a further optimized configuration of a filter, of which here once again two transducers W1, W2 are illustrated, which constitute, for example, an input transducer and an output transducer of the filter. In a manner similar to that described in the first exemplary embodiment (FIG. 1), here as well an upper connection pad AP21 of the second transducer W2 is connected via a coupling line KL1 to a coupling pad KP1, which is arranged in relative proximity to the lower connection pad AP12 of the first transducer W1 and forms a coupling capacitance CK1 with the latter.

In addition, a further artificially introduced coupling capacitance CK2 is realized in this exemplary embodiment, said coupling capacitance being formed between a second coupling pad KP2 and the lower connection pad AP22 of the second transducer. The second coupling pad KP2 is connected to the upper connection pad AP11 of the first transducer W1 via a lengthened electrode finger, that is to say transversely across the acoustic track. With these two coupling capacitances CK1 and CK2, a pair of connection pads far away from one another are in each case coupled to one another. Suitable dimensioning of the capacitance and thus of the coupling enables all couplings that occur between metallizations of the two transducers or of the filter to be completely compensated for.

In a modification of this exemplary embodiment, it is possible for the second coupling line KL2 to be connected to the upper connection pad AP11 not via a lengthened electrode finger but rather via a coupling line running around the two transducers. However, this would necessitate a crossover of the first coupling line KL1. This can be effected on the substrate, by means of an electrically insulating material being arranged in the crossing region between the two coupling lines. This can be an organic or inorganic dielectric correspondingly structured onto the region of the crossover of the two coupling lines.

However, it is also possible to guide the second coupling line at least in the crossing region in a different plane, in order to avoid a direct electrical contact of the two coupling lines KL1, KL2 with one another. The second plane can be, for example, on a carrier substrate, on a housing part or on the underside of the piezoelectric substrate on which the two transducers are realized. In the last case, it is necessary to guide the corresponding coupling line around the substrate edge or to guide it by means of a plated-through hole through the piezoelectric substrate.

A transition into a different plane on a carrier substrate or a housing can be effected via bumps or other electrically conductive elevated structures having a height exceeding the height of the other line to be crossed over.

FIG. 3 shows a further configuration of the invention, wherein, in a manner similar to that in FIG. 1, a coupling pad KP is connected via a coupling line KL to the upper connection pad of a first transducer W1. The coupling pad KP forms a coupling capacitance CK with the lower connection pad, that is to say with the more distant connection pad of the second transducer W2.

In addition to this measure that compensates for the capacitive cross-talk, a shielding that serves for reducing the electromagnetic cross-talk is also realized here. This shielding structure AS consists of one or a plurality of metallic strips connected to ground and running between the two transducers W1, W2 transversely via the acoustic track.

Preferably, the strips of the shielding structure AS have a greater width than the electrode fingers of the transducers W. In addition, the connection pads of the shielding structure AS are embodied with sufficient width and length that they project beyond or even partly enclose at least those ends of the adjacent connection pads AP of the two transducers W which face toward the shielding structure AS.

Solely this shielding structure connected to ground, and formed from the strips running via the acoustic track and the enlarged connection pads of said strips, suffices to avoid part of the cross-talk produced by electromagnetic coupling or to shield the electromagnetic fields induced by the current flow within one transducer in the direction of the adjacent transducer.

FIG. 4A shows a development of such a shielding structure AS for avoiding electromagnetic cross-talk. In this embodiment, that connection pad of the shielding structure AS which is connected to ground is guided completely around an adjacent connection pad AP11 of the first transducer W1. In this way, an electromagnetic field concentrated in the region of the bonding location—indicated by a circle—on the connection pad AP11 is shielded even better than in the exemplary embodiment in accordance with FIG. 3.

In addition, a capacitive decoupling is reduced here, too, by the introduction of a compensating coupling capacitance CK. The coupling capacitance is formed between the lower connection pad AP12 of the first transducer W1 and a coupling pad KP, which is connected via a coupling line KL to the upper connection pads AP21 of the second transducer W2. Owing to these two measures, the capacitive cross-talk between first and second transducers can be completely compensated for and the electromagnetic cross-talk can be substantially avoided by corresponding shielding of the connection pad AP of a transducer.

FIG. 4B shows a variant of FIG. 4A, wherein now the coupling line KL is guided on the other side around the transducers W1 and W2 and therefore now around the shielding structure.

FIG. 9 shows a further embodiment of the invention on the basis of a SAW filter having at least two acoustic tracks. A first transducer W11 connected to the input is arranged in a first track, said transducer being e.g. part of a resonator. Said transducer W11 is connected to two connection pads $AP_{IN1}$ and $AP_{IN2}$.

In a second acoustic track, parallel to the first track, five further transducers W21 to W25 are arranged alongside one another, of which three transducers W21, W23 and W25 are electrically connected in series with the transducer W11. The transducers W22 and W24 arranged in the second acoustic track alternately with respect to the transducers W21, W23 and W25 are connected to connection pads $AP_{OUT1}$, $AP_{OUT2}$ to be assigned to the output.

A coupling line KL here connects the connection pad $AP_{OUT2}$ of the output to a coupling pad KP arranged in the vicinity of the connection pad $AP_{IN2}$ connected to the input. As a result, the input is capacitively coupled to the output across two acoustic tracks.

In one embodiment (not illustrated), the coupling line KL can be guided through a transducer or a reflector of the second acoustic track.

FIG. 5 shows, in a further embodiment, how, in particular, the inductive cross-talk, or the coupling leading to the cross-talk, can be virtually completely compensated for. For this purpose, the current conduction, that is to say the precise course of the current path in the region of a transducer is predetermined such that a current loop is formed, which inductively generates an electromagnetic field. The current conduction is preferably designed such that an additional loop is also formed at least partly.

FIG. 5 illustrates a complete loop having a cross-sectional area F1 projected onto the substrate surface. Furthermore, a second loop having the cross-sectional area F2 projected onto the substrate surface is at least partly formed. On account of the crossover, a respective different sense of rotation and thus an oppositely polarized electromagnetic field arise for the two loops.

In the region of the first transducer W1, by means of a predetermined current conduction governed by the design, at least to some extent a further loop having a cross-sectional area F0 projected onto the substrate surface is formed, which generates a further electromagnetic field.

The electromagnetic field above the first transducer W1 now couples to the two fields formed by the inductive effect of the two current loops above the second transducer W2 in mutually opposite ways. According to the invention, it is now possible to set the ratio of cross-sectional areas F1 and F2 formed by the two current loops at the second transducer W2 such that the corresponding couplings to the field at the first transducer compensate for one another in the best possible way. In general, it is necessary for this purpose for the cross-sectional area of that loop which is further away from the first transducer W1 to be larger than the first current loop having the area F1, which first current loop is arranged closer to the first transducer W1.

All current-carrying parts, that is to say all metallizations on the substrate, the transducers W1, W2 and their connection pads AP, and corresponding conductor sections arranged on the substrate or, if appropriate, above or below the substrate, contribute to the formation of current loops in the region of a transducer. Bonding wires BD connected to the connection pads AP are illustrated as an example of such conductor sections.

In addition, the current which flows within the transducer from the upper to the lower connection pad, or vice versa, contributes to the current conduction even though no direct electrical coupling of the two partial electrodes of the two transducers takes place here. The electroacoustic conversion or the excitation of surface acoustic waves leads to an energy transfer which corresponds to a current flow and which takes place via a current path that can be assigned geometrically.

While the current conduction via conductor sections, bumps and bonding wires BD can be geometrically predetermined in a simple manner, the current conduction in a standard finger transducer generally cannot be controlled since the current is distributed approximately uniformly there via all fingers. However, it is possible to subdivide a transducer into longitudinal sections and to provide different cascading of transducer structures in the longitudinal sections.

A cascading is obtained if a transducer is divided into two partial transducers in a transverse direction, that is to say transversely with respect to the propagation direction of the surface acoustic wave, said partial transducers being interconnected in series with one another. The cascading reduces the voltage between the partial electrodes of the partial transducers and thus also the excitation intensity and the current flow which flows through this cascade. This means, as a result, that the current flow is greatest where the smallest degree of cascading is set.

In FIG. 5, the first transducer W1 is divided into three longitudinal segments, which constitute—as seen from the left to the right—a longitudinal segment having a four-fold cascade, a second longitudinal segment having a two-fold cascade and a third longitudinal segment having a six-fold cascade. The smallest degree of cascading here is in the second or middle longitudinal segment, such that the current path is effected transversely through the transducer predominantly by the second longitudinal segment. In FIG. 5, for the sake of simplicity, the cascading of the second transducer W2 is implemented in mirror-inverted fashion, such that here, too, the current path leading through the second transducer W2 is effected through the second longitudinal segment. This has the further advantage that already as a result the distance between the current pads in the two transducers is increased and the coupling is thus reduced.

In one configuration of the invention, the longitudinal segments can be varied such that the current path follows transversely through the corresponding transducer via a different longitudinal segment. In this way, it is possible to shift the current path and in this case also to change the cross-sectional area F of the respective current loop that is projected onto the substrate surface, and thus the strength of the electromagnetic field generated in this case. The lower part of FIG. 5 indicates how the simplified notation used in the upper part can be realized in the form of electrode structures of the transducer, that is to say by transducer structures.

In the exemplary embodiment in accordance with FIG. 5, the capacitive coupling between first and second transducers can be completely compensated for by corresponding setting of the coupling capacitance. Furthermore, the inductive or other forms of electromagnetic cross-talk can also be compensated for by corresponding shaping of the current loops. A filter on the basis of these two transducers therefore ideally no longer exhibits any cross-talk at all between input and output, such that signals induced by the cross-talk, which signals could possibly lead to the occurrence of interference signals during the signal transmission in an undesirable frequency range, also no longer occur in the transfer function.

FIG. 6 shows, in schematic cross section, a micro-acoustic filter, here specifically a SAW filter, which is constructed in the form of metallizations realizing transducer structures WS, conductor sections and connection pads on a piezoelectric substrate SU. The filter is electrically and mechanically connected to a carrier substrate TS via bump connections BU, wherein the transducer structures WS from which the transducers are formed are formed on that surface of the substrate SU which faces toward the carrier substrate TS.

The carrier substrate TS can be part of a housing and form the underside or topside thereof, for example. However, it is also possible to encapsulate the filter, which is substantially realized on the substrate, by means of a suitable covering terminating with the carrier substrate TS. Such a construction now makes it possible to form conductor sections LA on that surface of the substrate SU which faces the carrier substrate TS, on that surface of the carrier substrate TS which faces the substrate SU, and also within or below the carrier substrate. The arrangement of the conductor sections LAS and LAT on different planes makes it possible to design the current feed and outgoing conduction to the transducer structures such that the current loops elucidated in FIG. 5 are formed. For this purpose, it is also possible to produce the transition from one metallization plane to the next in the form of separate bumps serving only for the configuration of the current path. One of the metallization planes which contribute to the shaping of the current path can be arranged between two dielectric layers of the preferably multilayered carrier substrate TS. In addition, electrical connections can lead through the carrier substrate TS to external contacts of the filter arranged on the underside of said carrier substrate.

FIG. 7 shows, on the basis of a transfer curve (here the measured profile of the scattering parameter S21) the effect that can be achieved by reducing the capacitive cross-talk. The figure compares a filter comprising coupling line and coupling pad and embodied as in FIG. 3 with a similarly constructed filter having no coupling line and no coupling pad. The effect of the compensated capacitive coupling is shown particularly clearly in a frequency range below the passband. As a result of the shift in the frequency position of a pole present, the curve for the compensated filter (in accordance with FIG. 3) lies distinctly below the curve of the filter without compensated coupling.

FIGS. 8A and 8B show the transfer function of a SAW filter embodied in accordance with FIG. 5, on the basis of the scattering parameter S21, wherein FIG. 8A illustrates a narrower frequency range around the passband and FIG. 8B additionally illustrates the upper stop band. Here, too, it is evident that a significantly improved selection can be observed as a result of the compensated capacitive and electromagnetic couplings. In virtually all frequency ranges, the attenuation in the stop band is below the transfer curve of a filter without compensation of capacitive or electromagnetic cross-talk. This shows that by means of the proposed measures according to the invention, compensation for capacitive and electromagnetic cross-talk substantially to completely succeeds and, in this way, it is possible to obtain filters having an improved transfer response and, in particular, an improved selection in the stop band.

LIST OF REFERENCE SIGNS

AP connection pad
AS shielding structure
BD bonding wire
BU bump
CK coupling capacitance
F0, F1, F2 areas within current loops
KL coupling line
KP coupling pad
$LA_T$, $LA_S$ (metallic) conductor section
SU piezoelectric substrate
TS carrier substrate
W1, W2 first, second transducer
WS transducer structures

The invention claimed is:
1. A micro-acoustic filter comprising:
a first and a second transducer, which are realized on a common piezoelectric substrate,
wherein the first transducer and the second transducer each have two connection pads; and
a coupling line, which connects a first connection pad of the first transducer to a coupling pad, wherein the coupling pad is embodied as a metal area and is arranged in the vicinity of that connection pad of the second transducer which is at the greater distance from the first connection pad of the first transducer, wherein, in at least one of the transducers, the current path to this transducer, comprising the current feeds to the connection pads, the connection pads themselves and that portion of the current path which runs via the acoustic system, forms at least one crossover, such that a complete first loop and at least one part of a second loop are formed in the imaginary geometrical projection of the current path onto the substrate plane, wherein the current path to or through the other one of the transducers forms a third loop, wherein a respective inductive coupling takes place between the first and third and between the second and third loops, and wherein the areas enclosed by first and second loops and projected onto the substrate are in a ratio to one another such that the two inductive couplings mutually compensate for one another.

2. The filter according to claim 1, wherein the first and second transducers are separated by a shielding structure, which is connected to ground via at least one connection pad, and wherein the shielding structure comprises metallic strips, which either are guided transversely via an acoustic track of a filter embodied as an SAW filter, the first and second transducers that couple to one another being arranged in said track, or are arranged between the connection pads or electrodes of the first and second transducers that couple to one another.

3. The filter according to claim 2, wherein a connection pad of the shielding structure is guided at least partly around an adjacent connection pad of one of the transducers.

4. The filter according to claim 1, wherein the coupling line either is embodied as a metallic conductor section running on the substrate, or is embodied as a bonding wire or other conductor section arranged not directly on, but rather above or below the substrate.

5. The filter according to claim 1, wherein in the at least one of the transducers in which the current path forms the complete first loop and the at least one part of the second loop, inductively generated electromagnetic fields in the first loop and the second loop are oppositely polarized.

6. The filter according to claim 1, wherein the filter comprises a chip formed from the material of the substrate, wherein the chip is mounted on a housing lower part or a carrier substrate, wherein the connection pads on the chip are connected to external connections at the underside of the housing lower part or of the carrier substrate by means of bonding wires via connection areas on the housing lower part or on the carrier substrate, and wherein the current paths shaped to form loops at least partly comprise the bonding wires.

7. The filter according to claim 1, wherein the filter comprises a chip formed from the material of the substrate, wherein the chip is mounted by means of flip-chip connections on a housing lower part or a carrier substrate, and wherein one of the loops is formed by the connection pads, that portion of the current path which runs via the acoustic system, the flip-chip connections and conductor sections arranged on the housing lower part or the carrier substrate.

8. The filter according to claim 1, embodied as an SAW filter, wherein at least one of the transducers is cascaded, wherein the cascading is different in at least two longitudinal sections of the transducer, and wherein that section of the current path which is formed by the acoustic system runs substantially transversely through that longitudinal section of the transducer which has the smallest degree of cascading.

9. A method for reducing cross-talk in a micro-acoustic filter, the filter comprising a first and a second transducer, which are realized on a common piezoelectric substrate, wherein the first transducer and the second transducer each have two connection pads, and a coupling line, which connects a first connection pad of the first transducer to a coupling pad, wherein the coupling pad is embodied as a metal area and is arranged in the vicinity of that connection pad of the second transducer which is at the greater distance from the first connection pad of the first transducer, the method comprising:

varying the size of the coupling pad and/or the distance thereof from the more distant connection pad of the second transducer until optimum decoupling to is achieved;

a) providing the coupling pad with a sufficient size;

b) determining filter properties suitable for determining the coupling;

c) reducing the area of the metallic coupling pad by material removal by a relatively small amount relative to the size of the coupling pad;

d) determining at least one of the filter properties anew;

e) determining whether said at least one of the filter properties has changed positively by comparison with the determination in method step b), and repeating steps c) and d) in the case of an improvement being determined.

10. The method according to claim 9, with method step b) further comprising:

determining the transfer function of the filter; and using the suppression in a given stop band as a measure of the coupling.

11. The method according to claim 9, further comprising:

in method steps b) and d), determining the transfer function of the filter and determining the number of phase changes of the transfer function in a given frequency range all around a passband of the filter as a measure of the coupling, wherein method step e) involves checking whether an increase in the number of phase changes has taken place, and wherein an increase is evaluated as improved decoupling.

* * * * *